US007872276B2

(12) United States Patent
Lee et al.

(10) Patent No.: US 7,872,276 B2
(45) Date of Patent: Jan. 18, 2011

(54) VERTICAL GALLIUM NITRIDE-BASED LIGHT EMITTING DIODE AND METHOD OF MANUFACTURING THE SAME

(75) Inventors: Su Yeol Lee, Gyeonggi-Do (KR); Bang Won Oh, Gyeonggi-Do (KR); Doo Go Baik, Gyeonggi-Do (KR); Tae Sung Jang, Gyeonggi-Do (KR); Jong Gun Woo, Gyeonggi-Do (KR); Seok Beom Choi, Daejeon (KR); Sang Ho Yoon, Gyeonggi-Do (KR); Dong Woo Kim, Seoul (KR); In Tae Yeo, Seoul (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 543 days.

(21) Appl. No.: 11/742,818

(22) Filed: May 1, 2007

(65) Prior Publication Data

US 2008/0048206 A1 Feb. 28, 2008

(30) Foreign Application Priority Data

Aug. 23, 2006 (KR) .................... 10-2006-0079703
Feb. 21, 2007 (KR) .................... 10-2007-0017519

(51) Int. Cl.
 *H01L 33/00* (2010.01)
(52) U.S. Cl. ........................................... 257/99
(58) Field of Classification Search ............ 257/99, 257/103, 676, 773
 See application file for complete search history.

(56) References Cited

U.S. PATENT DOCUMENTS 6,417,525 B1 7/2002 Hata (Continued)

FOREIGN PATENT DOCUMENTS

CN 1250546 A 4/2000

(Continued)

OTHER PUBLICATIONS

Chinese Patent Office, Office Action issued Jul. 18, 2008.

(Continued)

*Primary Examiner*—Kiesha R Bryant
*Assistant Examiner*—Mark W Tornow
(74) *Attorney, Agent, or Firm*—Lowe Hauptman Ham & Berner LLP

(57) ABSTRACT

A method of manufacturing a vertical GaN-based LED comprises forming a light emission structure in which an n-type GaN-based semiconductor layer, an active layer, and a p-type GaN-based semiconductor layer are sequentially laminated on a substrate; etching the light emission structure such that the light emission structure is divided into units of LED; forming a p-electrode on each of the divided light emission structures; filling a non-conductive material between the divided light emission structures; forming a metal seed layer on the resulting structure; forming a first plated layer on the metal seed layer excluding a region between the light emission structures; forming a second plated layer on the metal seed layer between the first plated layers; separating the substrate from the light emission structures; removing the non-conductive material between the light emission structures exposed by separating the substrate; forming an n-electrode on the n-type GaN-based semiconductor layer; and removing portions of the metal seed layer and the second plated layer between the light emission structures.

7 Claims, 15 Drawing Sheets

U.S. PATENT DOCUMENTS

| | | | |
|---|---|---|---|
| 7,244,628 B2 | 7/2007 | Tamura et al. | |
| 2003/0122898 A1* | 7/2003 | Beerling et al. | 347/57 |
| 2003/0141506 A1 | 7/2003 | Sano et al. | |
| 2004/0235210 A1* | 11/2004 | Tamura et al. | 438/22 |
| 2005/0051789 A1* | 3/2005 | Negley et al. | 257/99 |
| 2005/0156185 A1 | 7/2005 | Kim et al. | |
| 2005/0242365 A1* | 11/2005 | Yoo | 257/103 |
| 2005/0269588 A1 | 12/2005 | Kim et al. | |
| 2005/0282373 A1 | 12/2005 | Bader et al. | |
| 2006/0065905 A1 | 3/2006 | Eisert et al. | |
| 2007/0181891 A1 | 8/2007 | Eisert et al. | |
| 2007/0262341 A1* | 11/2007 | Liu et al. | 257/103 |
| 2009/0275154 A1 | 11/2009 | Suzukie et al. | |

FOREIGN PATENT DOCUMENTS

| | | |
|---|---|---|
| CN | 1645634 A | 7/2005 |
| JP | 2003532298 A | 10/2003 |
| JP | 2005012188 A | 1/2005 |
| JP | 2005252222 A | 9/2005 |
| JP | 2006516066 A | 6/2006 |
| JP | 2006339294 A | 12/2006 |
| KR | 1020050070854 A | 7/2005 |
| KR | 1020060059783 A | 6/2006 |
| KR | 100617873 B1 | 8/2006 |
| WO | 03065464 A1 | 8/2003 |
| WO | 2005064666 A1 | 7/2005 |

OTHER PUBLICATIONS

Notice of Office Action for Japanese Application No. 2007-111743 mailed May 18, 2010.

Chinese Office Action for application No. 200810184082.4, issued Oct. 8, 2010.

* cited by examiner

Prior Art
[FIG. 1A]
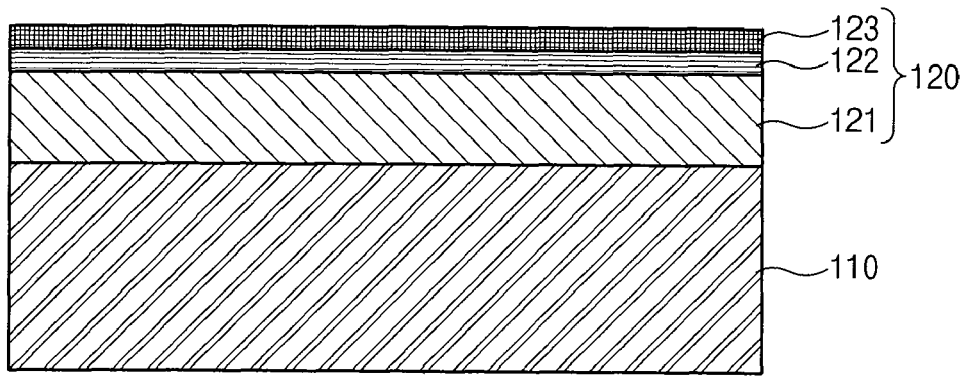
[FIG. 1B]
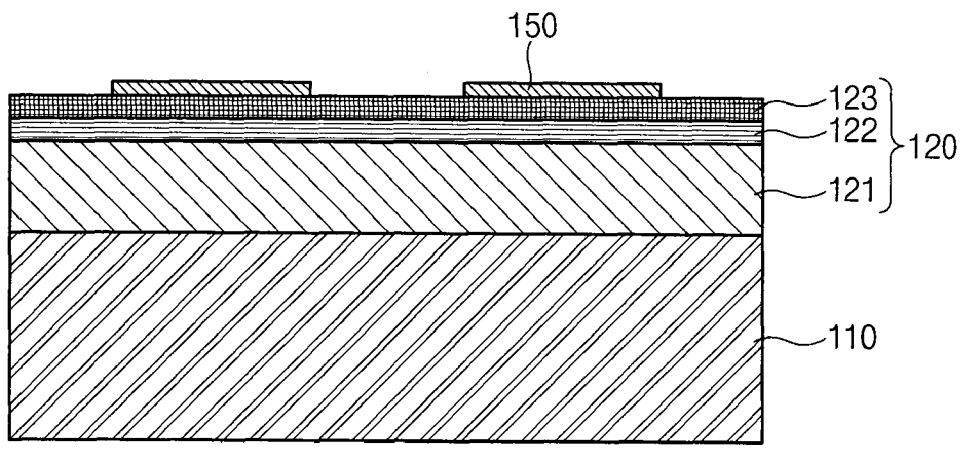
[FIG. 1C]
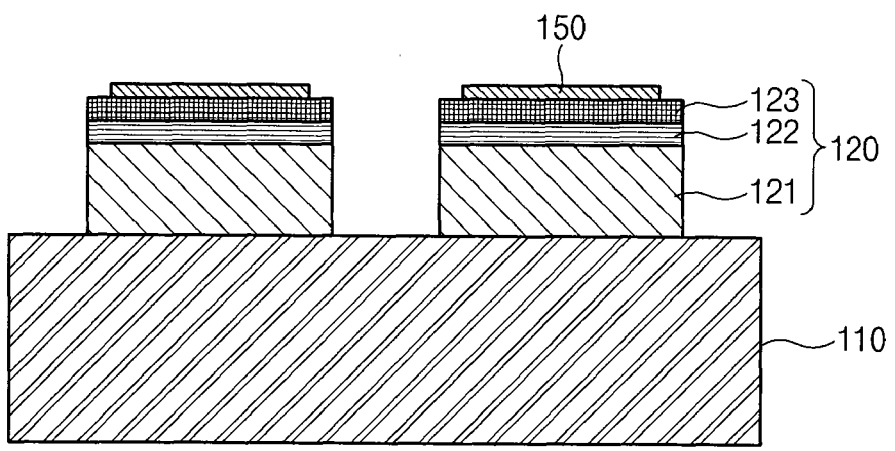

[FIG. 1D] Prior Art
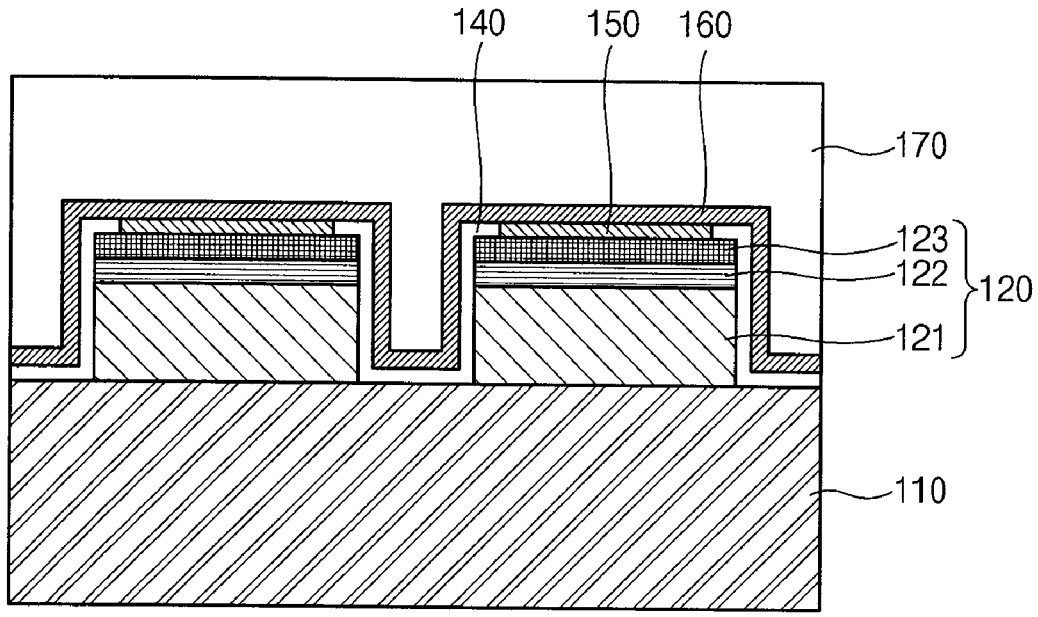
[FIG. 1E] Prior Art
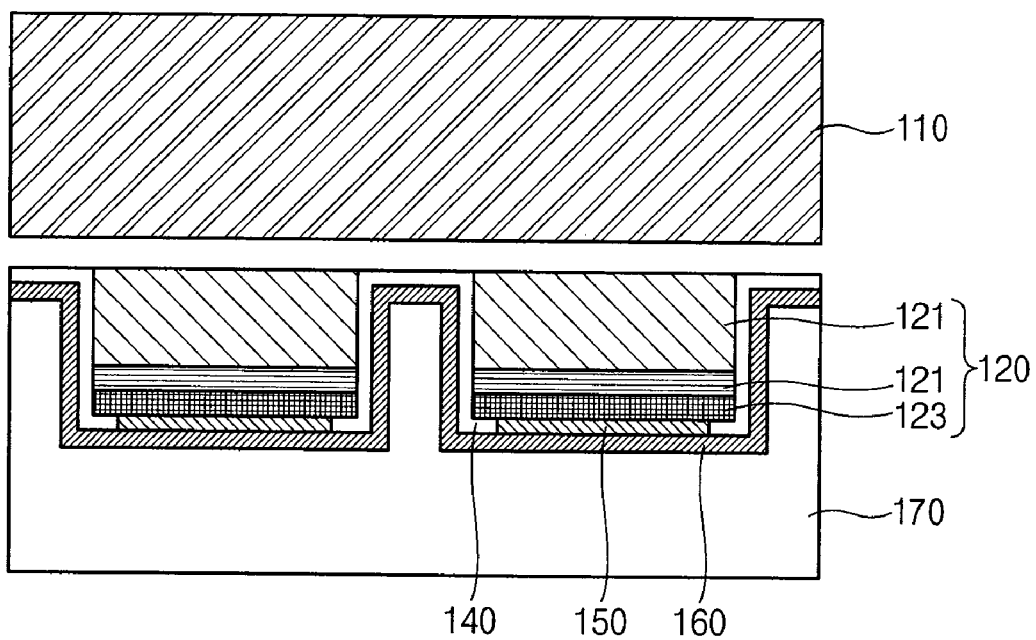

[FIG. 1F]    Prior Art
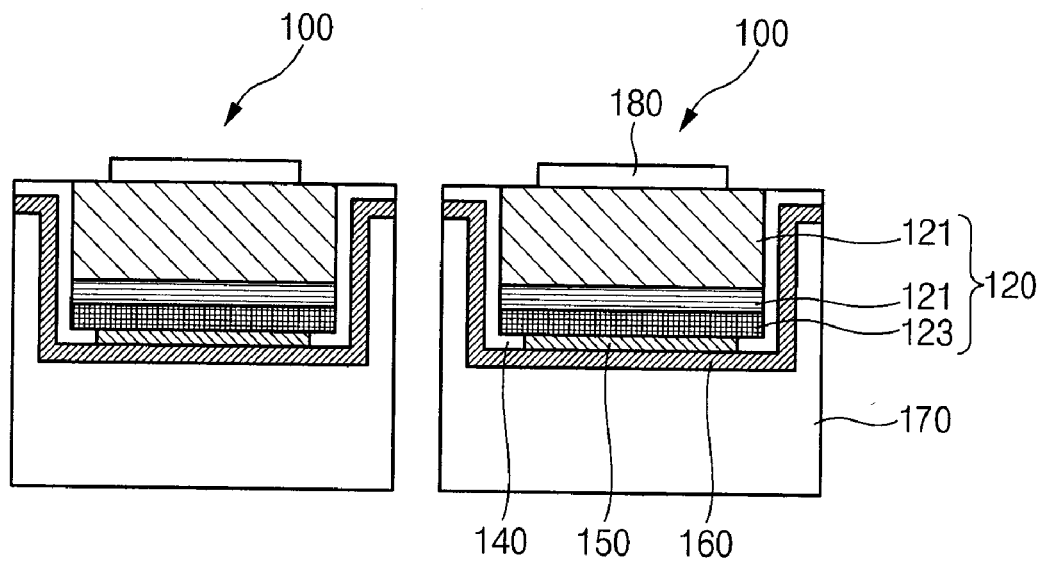
[FIG. 2]    Prior Art
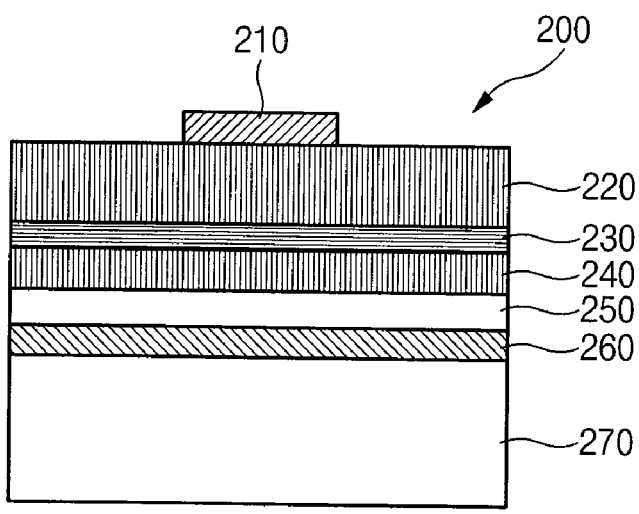

[FIG. 3]
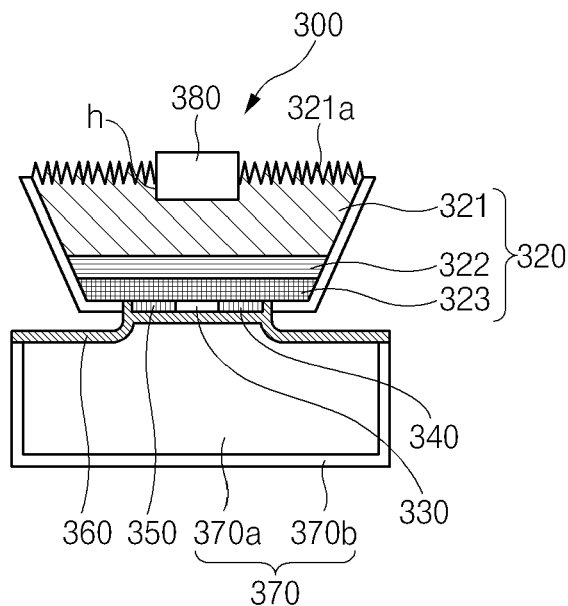
[FIG. 4A]
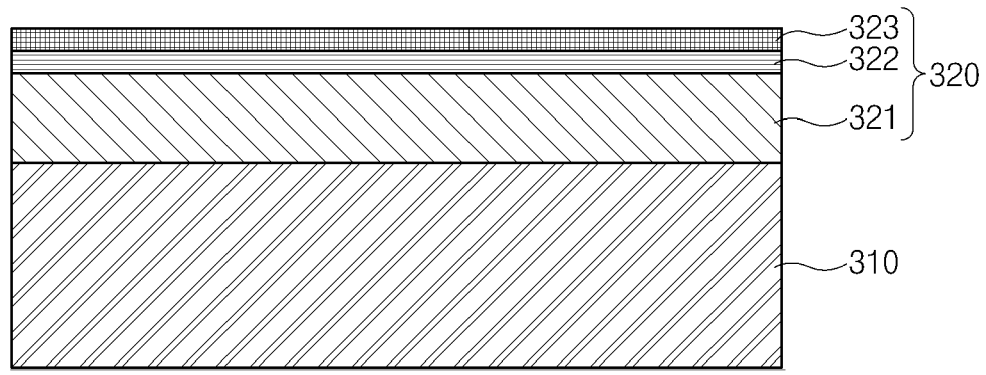
[FIG. 4B]
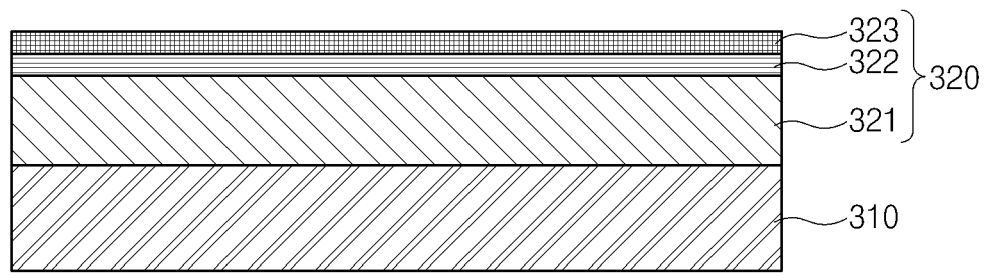

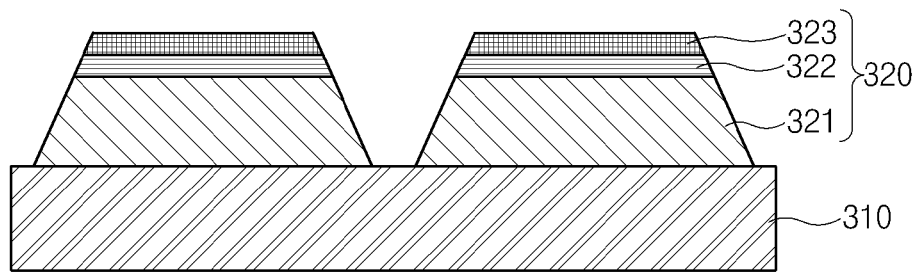
[FIG. 4C]
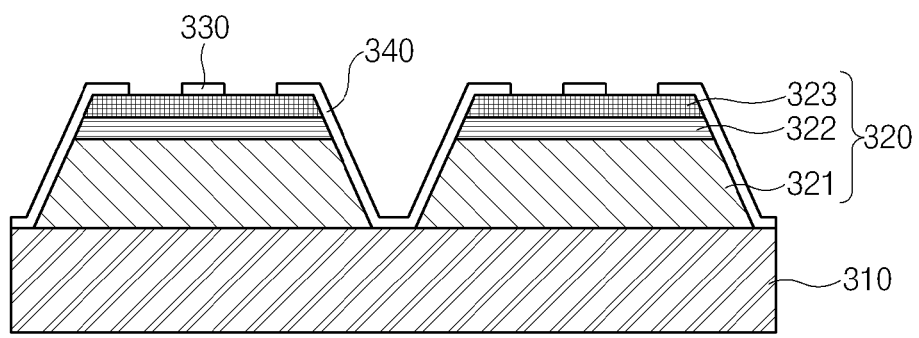
[FIG. 4D]
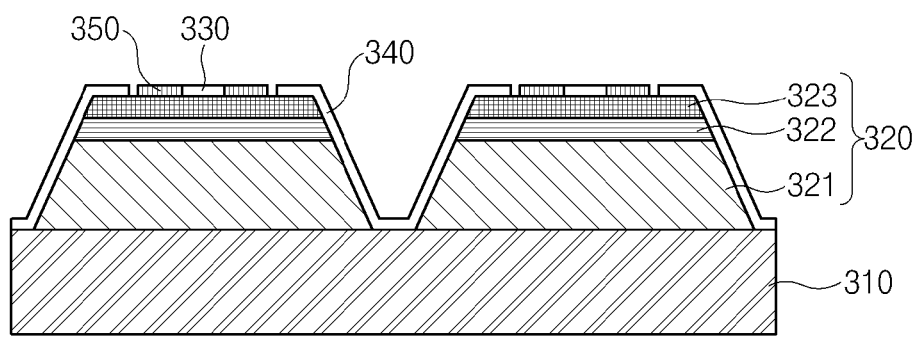
[FIG. 4E]
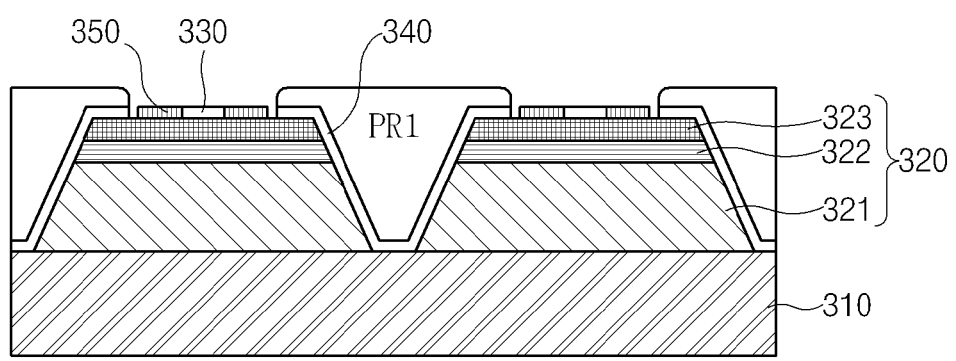
[FIG. 4F]

[FIG. 4G]
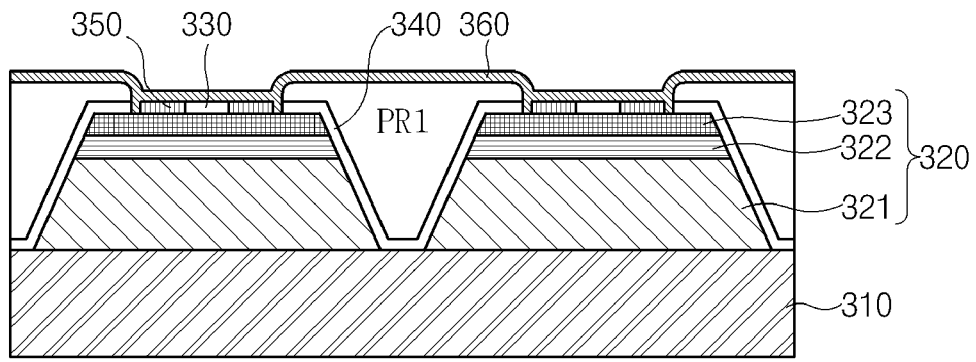
[FIG. 4H]
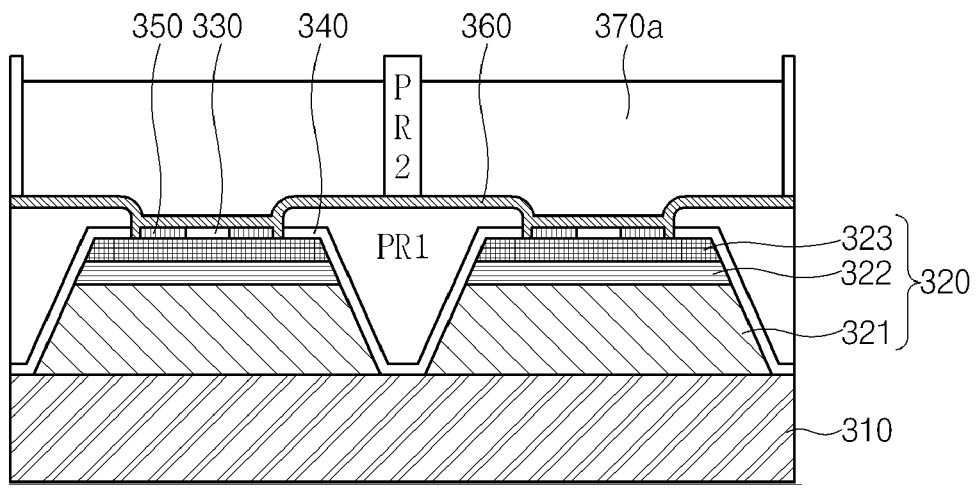
[FIG. 4I]
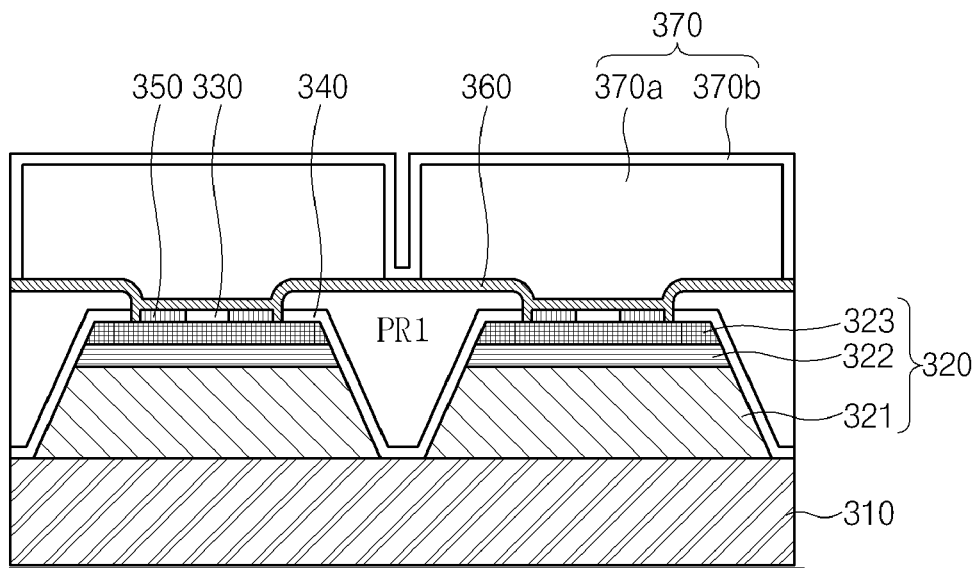

[FIG. 4J]
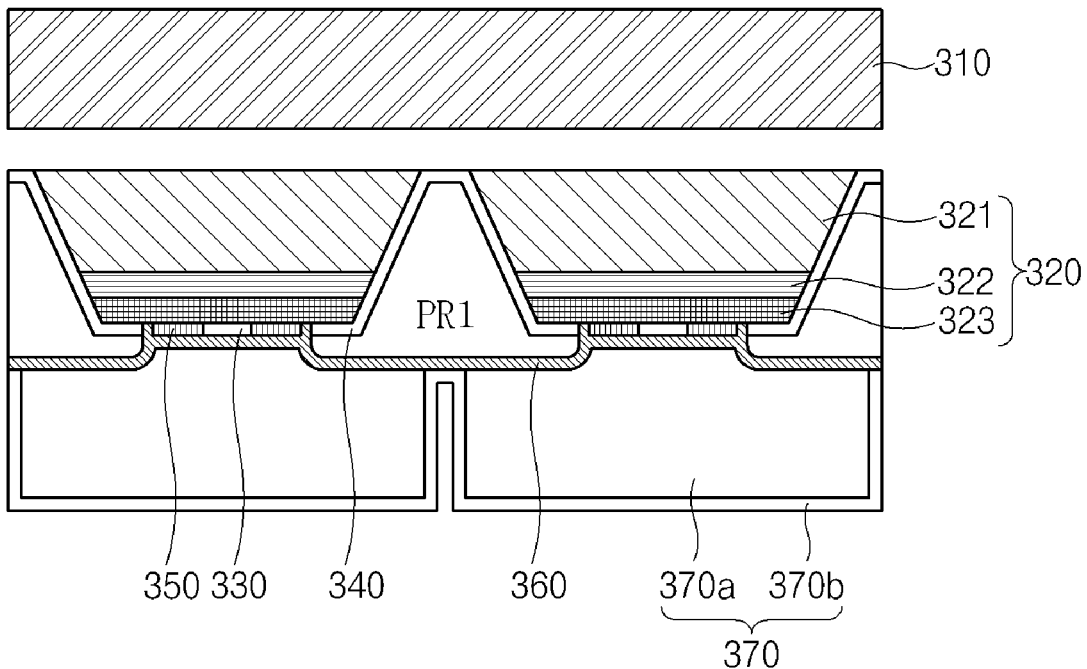
[FIG. 4K]
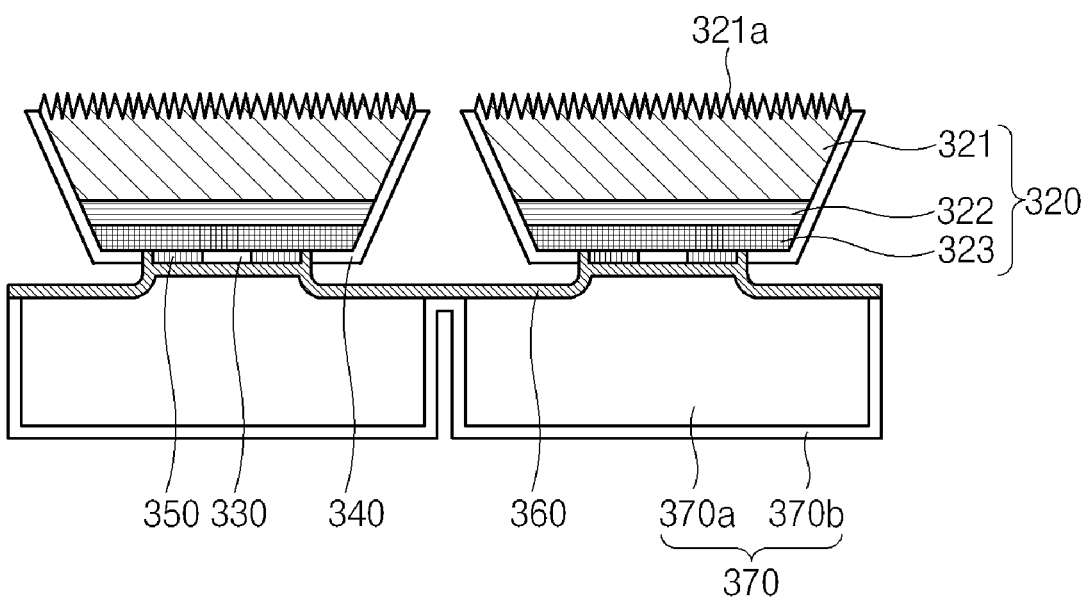

[FIG. 4L]
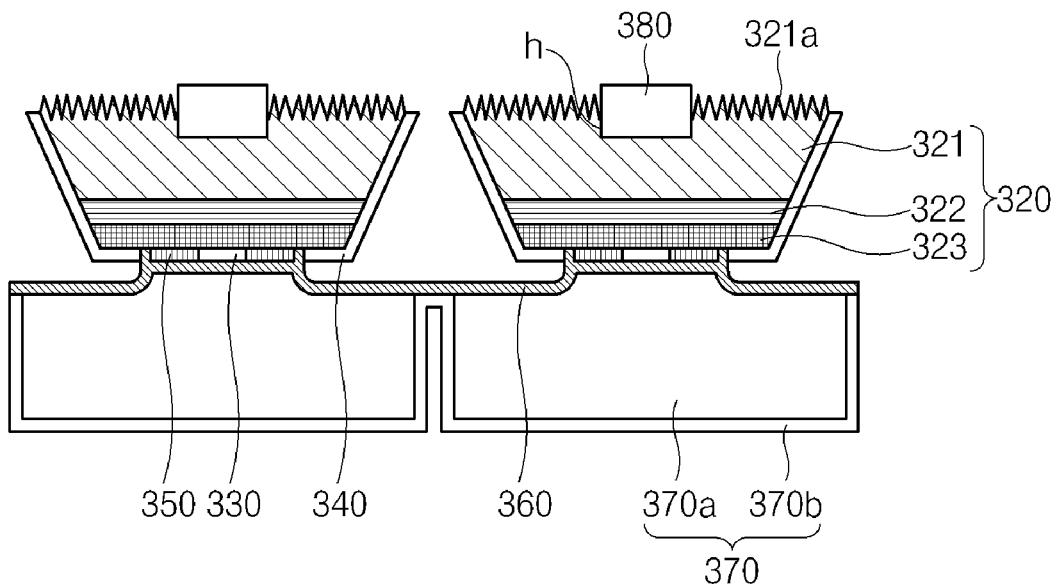
[FIG. 4M]
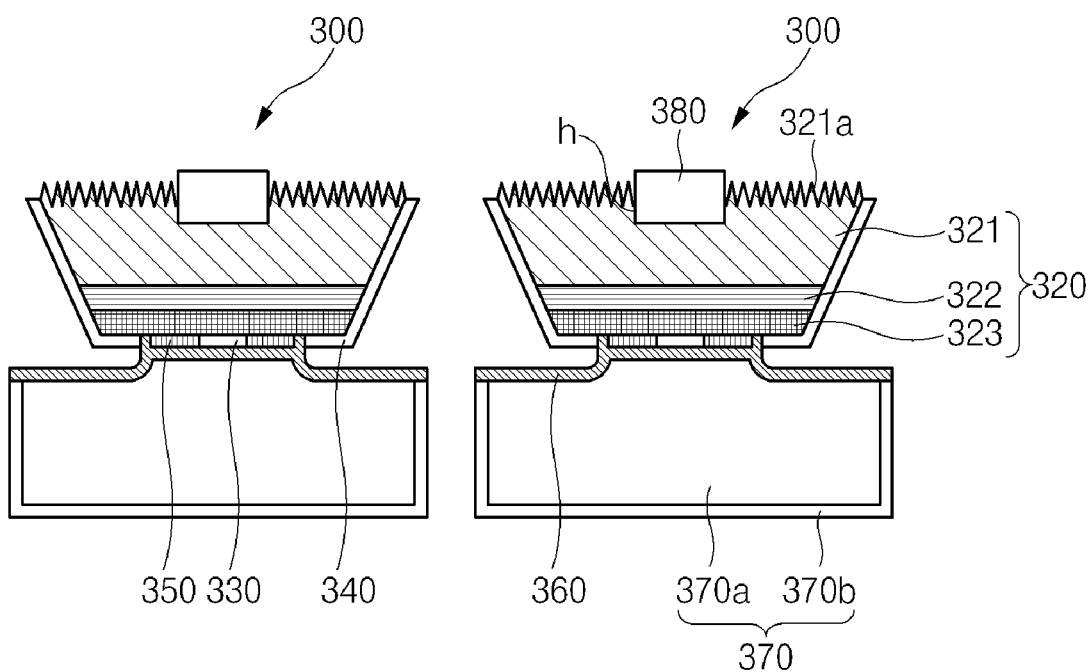

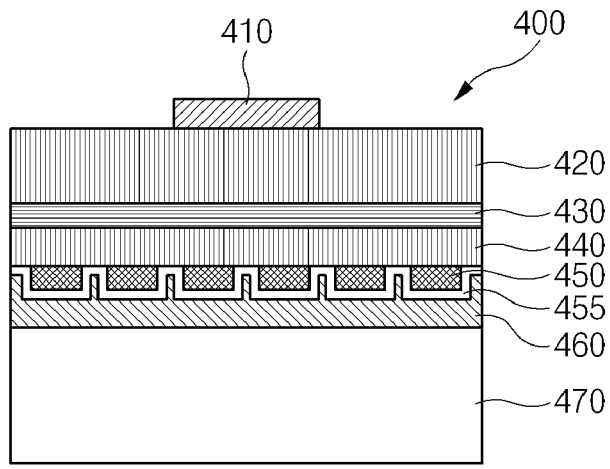
[FIG. 5]
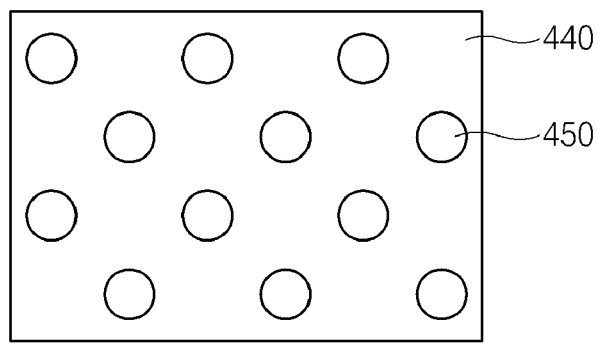
[FIG. 6]
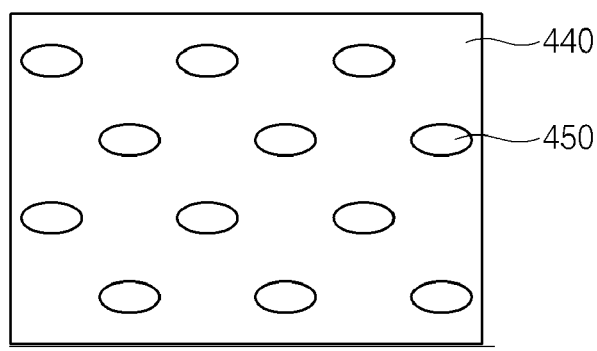
[FIG. 7]
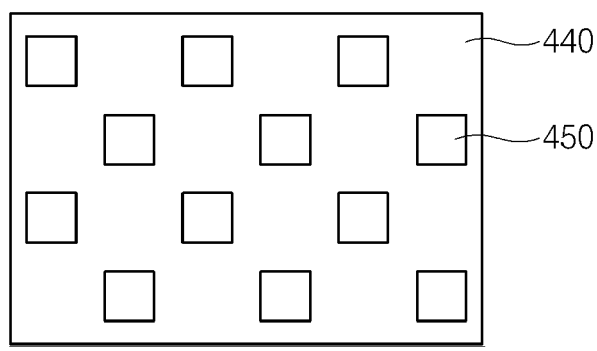
[FIG. 8]

[FIG. 9A]
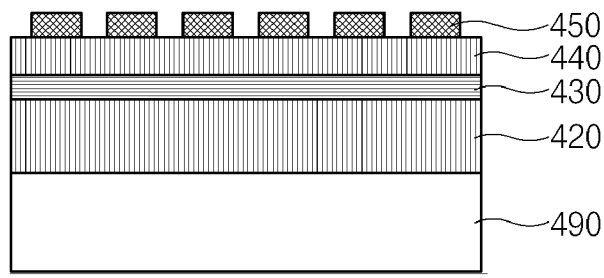
[FIG. 9B]
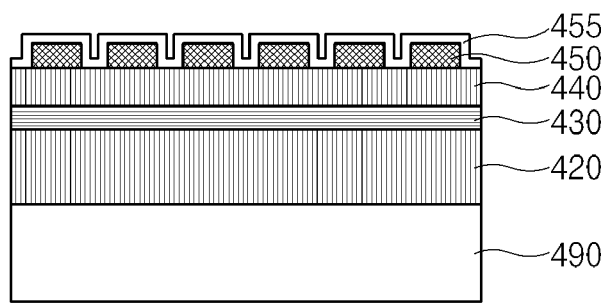
[FIG. 9C]
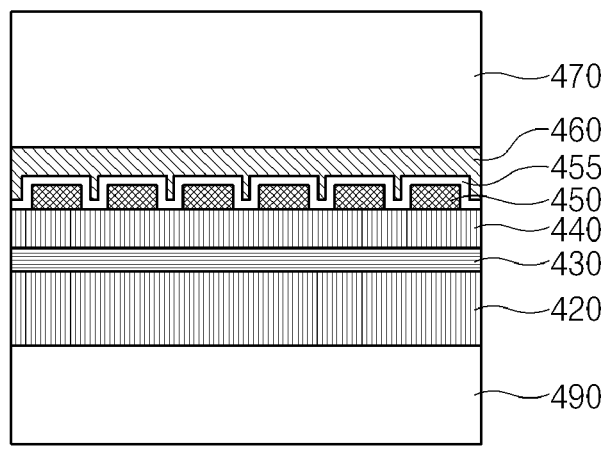
[FIG. 9D]
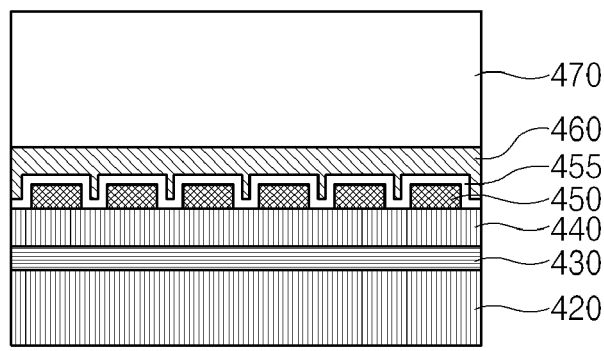

[FIG. 9E]
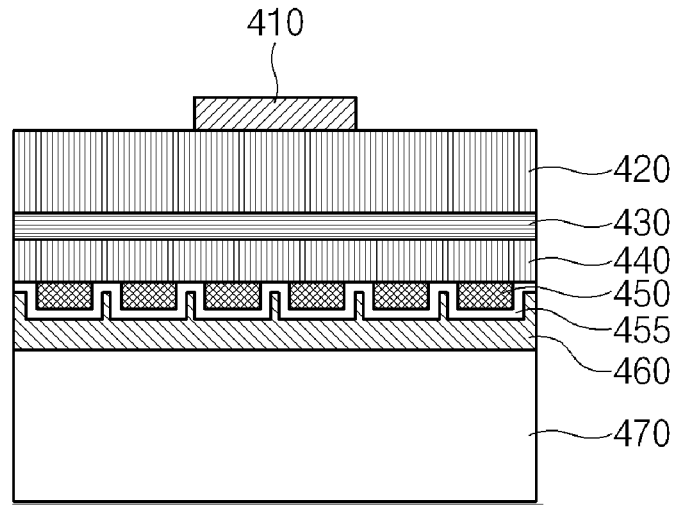
[FIG. 10]
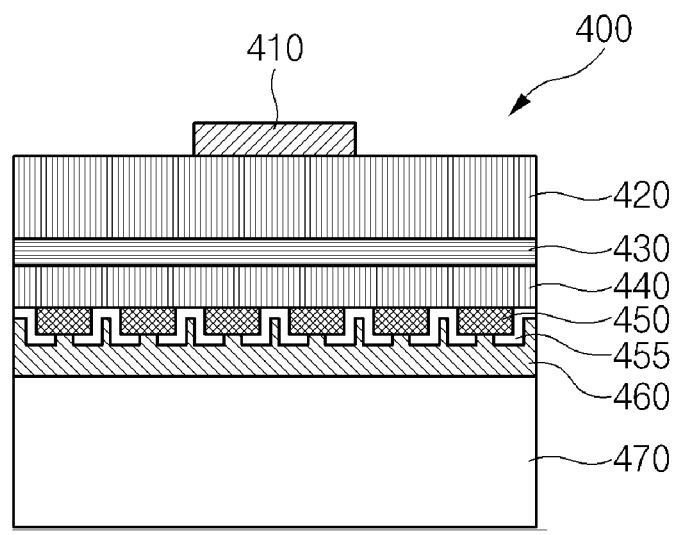
[FIG. 11]
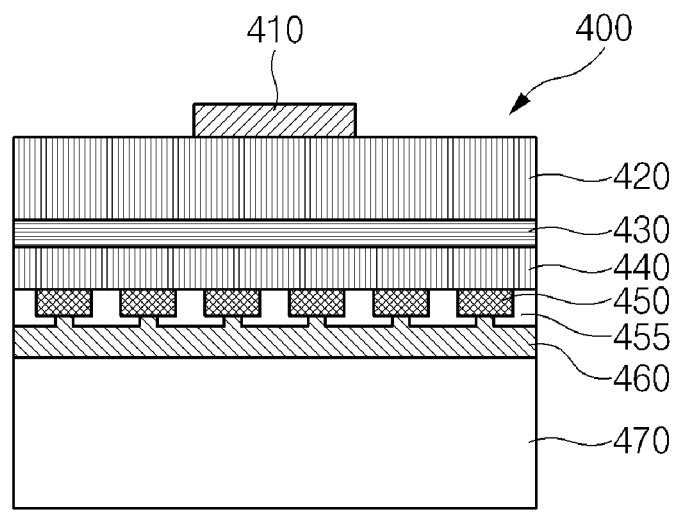

[FIG. 12]
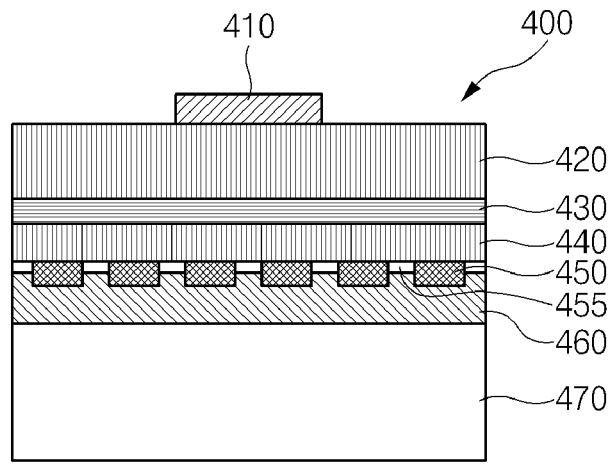
[FIG. 13A]
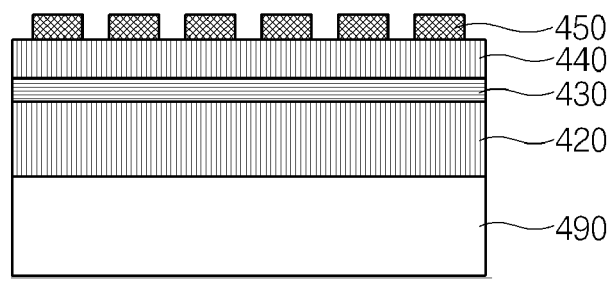
[FIG. 13B]
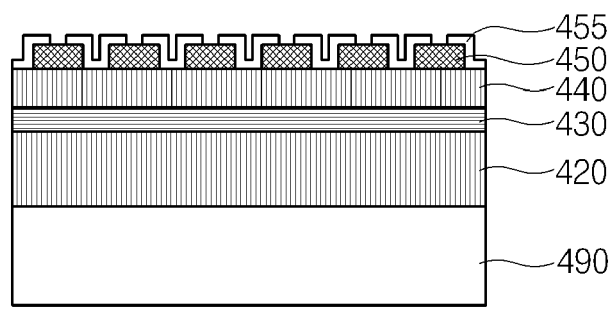
[FIG. 13C]
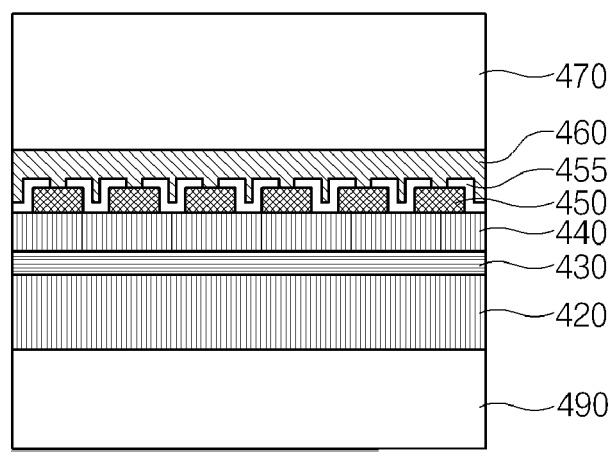

[FIG. 13D]
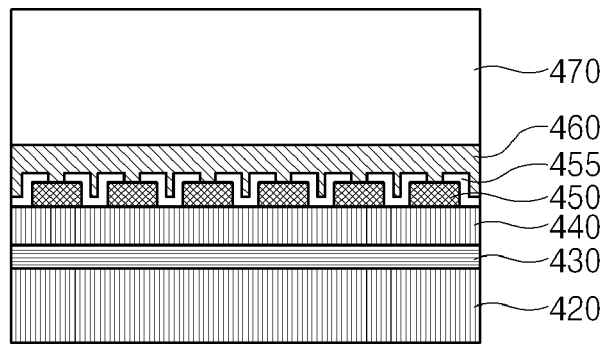
[FIG. 13E]
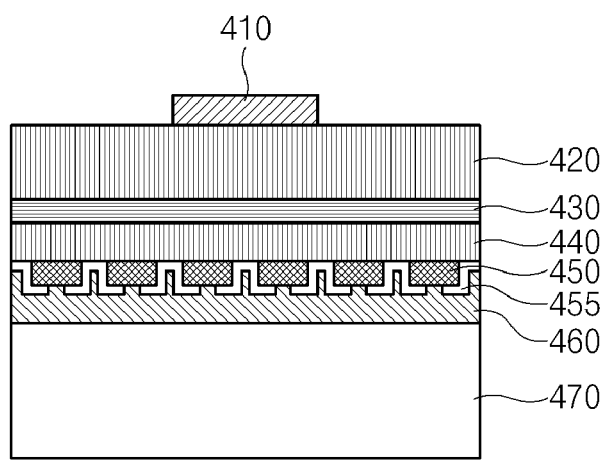
[FIG. 14]
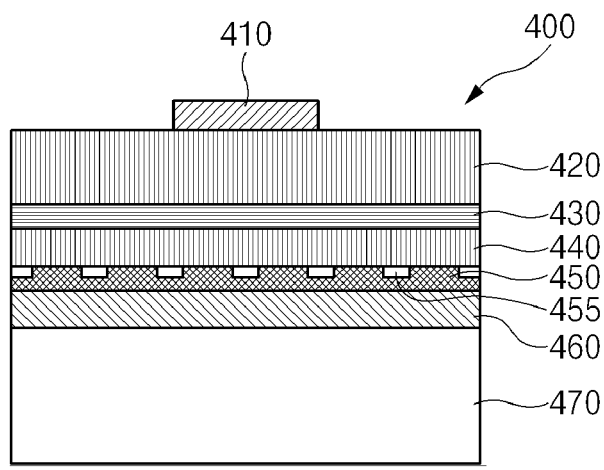

[FIG. 15A]
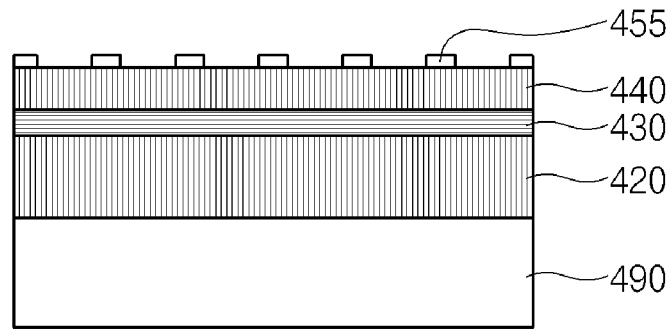
[FIG. 15B]
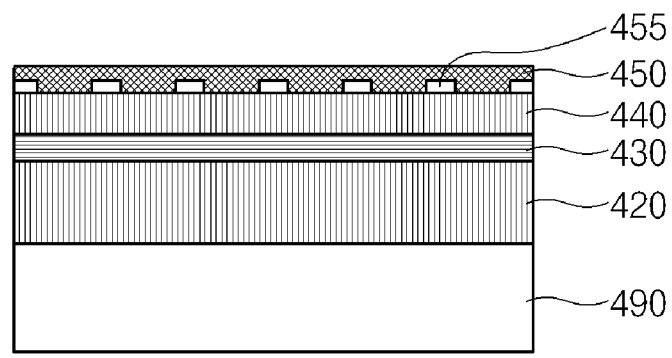
[FIG. 15C]
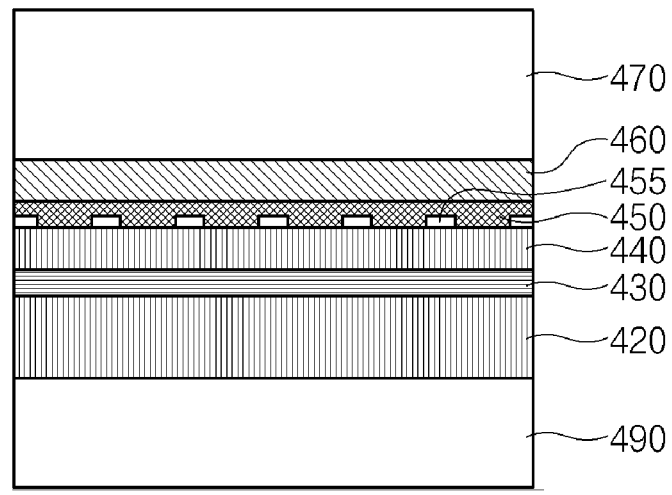

[FIG. 15D]
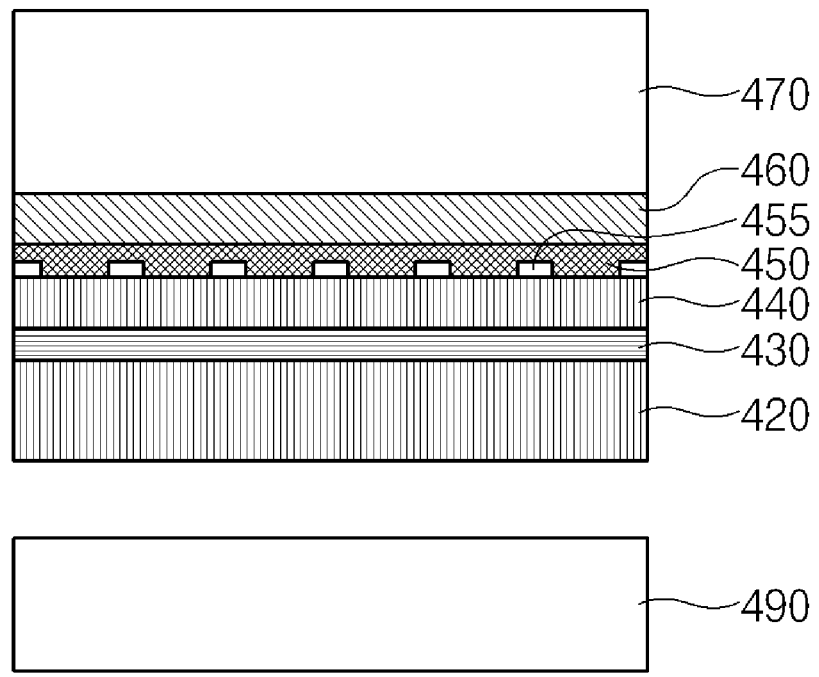
[FIG. 15E]
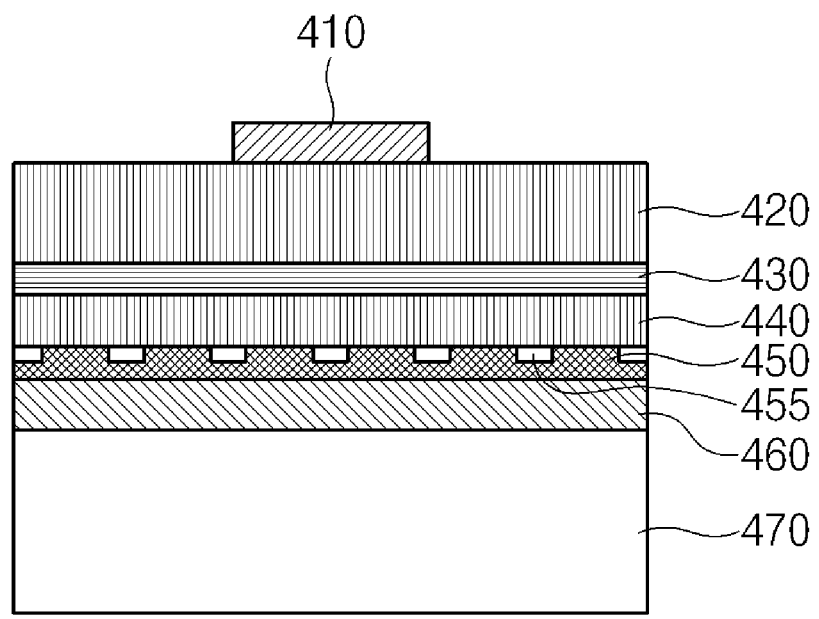

VERTICAL GALLIUM NITRIDE-BASED LIGHT EMITTING DIODE AND METHOD OF MANUFACTURING THE SAME

CROSS-REFERENCE TO RELATED APPLICATIONS

This application claims the benefit of Korean Patent Application No. 10-2006-0079703 filed with the Korean Intellectual Property Office on Aug. 23, 2006 and Korean Patent Application No. 10-2007-0017519 filed with the Korean Intellectual Property Office on Feb. 21, 2007, the disclosure of which is incorporated herein by reference.

BACKGROUND OF THE INVENTION

1. Field of the Invention

The present invention relates to a vertical gallium nitride-based light emitting diode (hereinafter, referred to as 'a vertical GaN-based LED') and a method of manufacturing the same, which can enhance reliability of an LED.

2. Description of the Related Art

Generally, a nitride-based semiconductor LED is grown on a sapphire substrate, but the sapphire substrate is a rigid nonconductor and has poor thermal conductivity. Therefore, there is a limitation in reducing the manufacturing costs by decreasing the size of a nitride-based semiconductor LED, or improving the optical power and chip characteristic. Particularly, because the application of a high current is essential for achieving high power LED, it is important to solve a heat-sink problem of the LED. To solve this problem, there has been proposed a vertical nitride-based LED in which a sapphire substrate is removed using a laser lift-off (LLO).

Hereinafter, the problems of a conventional GaN-based LED will be described in detail with reference to FIGS. 1A to 1F and 2.

FIGS. 1A to 1F are sectional views sequentially showing a method of manufacturing a conventional vertical GaN-based LED.

As shown in FIG. 1A, a light emission structure 120 composed of a GaN-based semiconductor layer is formed on a sapphire substrate 110. The light emission structure 120 includes an n-type GaN-based semiconductor layer 121, an active layer 122 composed of a GaN/InGaN layer with a multi-quantum well structure, and a p-type GaN-based semiconductor layer 123, which are sequentially laminated.

Subsequently, as shown in FIG. 1B, a plurality of positive electrodes (p-electrodes) 150 is formed on the p-type GaN-based semiconductor layer 123. Each of the p-electrodes 150 serves as an electrode and reflecting film.

Next, as shown in FIG. 1C, the light emission structure 120 is divided into units of LED through a RIE (reactive ion etching) process or the like.

Then, as shown in FIG. 1D, a protective film 140 is formed on the entire resulting structure such that the p-electrodes 150 are exposed. Next, a metal seed layer 160 is formed on the protective film 140 and the p-electrode 150, and electroplating or electroless plating is performed by using the metal seed layer 160 such that a structure support layer 170 composed of a plated layer is formed. The structure support layer 170 serves as a support layer and electrode of a finalized LED. At this time, the structure support layer 170 is also formed in a region between the light emission structures 120. Therefore, the structure support layer 170 formed in this region has a relatively large thickness.

Next, as shown in FIG. 1E, the sapphire substrate 110 is separated from the light emission structures 210 through an LLO process.

Subsequently, as shown in FIG. 1F, a negative electrode (n-electrode) 180 is formed on each of the n-type GaN-based semiconductor layers 121 exposed by separating the sapphire substrate 110. The structure support layer 170 is separated through a dicing or laser scribing process such that a plurality of GaN-based LEDs 100 is formed.

However, while the dicing or laser scribing of the structure support layer 170 having a relatively large thickness is performed, the light emission structure 120 may be broken or damaged.

Further, when the structure support layer 170 is formed, the overall structure including the structure support layer 170 is bent due to a difference in thermal expansion coefficient between the light emission structure 120 and the structure support layer 170 which is formed between the respective light emission structures 120. Therefore, it is not easy to perform a subsequent process.

Further, atoms composing the metal seed layer 160 penetrate into the active layer 122 such that junction leakage or a short circuit may occur.

As described above, when a vertical GaN-based LED is manufactured according to the related art, the reliability of the vertical GaN-based LED is degraded due to the above-described problems.

Meanwhile, another conventional vertical GaN-based LED can be manufactured according to a method to be described with reference to FIG. 2.

FIG. 2 is a sectional view illustrating the structure of another conventional vertical GaN-based LED.

As shown in FIG. 2, the vertical GaN-based LED has a structure support layer 270 formed in the lowermost portion thereof, the structure support layer 270 serving as a support layer of an LED. The structure support layer 270 may be formed of an Si substrate, a GaAs substrate, or a metal layer.

On the structure support layer 270, a bonding layer 260 and a reflecting electrode 250 are sequentially formed. Preferably, the reflecting electrode 250 is composed of metal with high reflectance so as to serve as an electrode and reflecting layer.

On the reflecting electrode 250, a p-type GaN-based semiconductor layer 240, an active layer 230 composed of a GaN/InGaN layer with a multi-quantum well structure, and an n-type GaN-based semiconductor layer 220 are sequentially formed.

On the n-type GaN-based semiconductor layer 220, an n-electrode 210 is formed. Between the n-type GaN-based semiconductor layer 220 and the n-electrode 210, a transparent electrode (not shown) may be further formed so as to enhance a current spreading effect.

In the conventional vertical GaN-based LED 200, the reflecting electrode 250 is formed on the entire surface of the p-type GaN-based semiconductor layer 240 such that light to be generated from the active layer 230 is reflected by the reflecting electrode 250 so as to escape to the outside. However, when the reflecting electrode 250 is formed on the entire surface of the p-type GaN-based semiconductor layer 240, a polarization effect occurs when the LED operates. Therefore, a piezoelectric effect occurs so that the reliability of the LED is degraded.

SUMMARY OF THE INVENTION

An advantage of the present invention is that it provides a vertical GaN-based LED and a method of manufacturing the same in which facilitates a dicing or scribing process for separating LEDs and prevents an overall structure including a structure support layer from being bent or short-circuited, thereby enhancing the reliability of an LED.

Another advantage of the invention is that it provides a vertical GaN-based LED and a method of manufacturing the same which can enhance the reliability of an LED by reducing a piezoelectric effect caused by a reflecting electrode which is formed on a p-type GaN-based semiconductor layer.

Additional aspect and advantages of the present general inventive concept will be set forth in part in the description which follows and, in part, will be obvious from the description, or may be learned by practice of the general inventive concept.

According to an aspect of the invention, a GaN-based LED comprises an n-electrode; a light emission structure formed under the n-electrode; a protective film formed on the outer surface of the light emission structure; a p-electrode formed under the light emission structure where the protective film is formed; a metal seed layer formed on the light emission structure and the entire surface of the p-electrode; and a conductive substrate formed under the metal seed layer.

Preferably, the light emission structure includes an n-type GaN-based semiconductor layer, an active layer, and a p-type GaN-based semiconductor layer.

Preferably, the n-type GaN-based semiconductor layer has surface irregularities formed on the upper surface thereof. The GaN-based LED further comprises a current blocking layer formed in the central portion of the lower surface of the light emission structure.

Preferably, the conductive substrate includes first and second plated layers. More specifically, the first plated layer has a two-layer structure in which Ni and Au are sequentially laminated, and the second plated layer has a three-layer structure in which Au, Ni, and Au are sequentially laminated.

According to another aspect of the invention, a vertical GaN-based semiconductor LED comprises a conductive substrate; a metal seed layer formed on the conductive substrate; a current blocking layer formed in the central portion of the metal seed layer; a first electrode formed on the metal seed layer and in either side of the current blocking layer; a protective film formed on the outer surface of a light emission structure formed on the first electrode; and a second electrode formed on the light emission structure.

Preferably, the light emission structure includes a p-type GaN-based semiconductor layer, an active layer, and an n-type GaN-based semiconductor layer, and the n-type GaN-based semiconductor layer has surface irregularities formed on the upper surface thereof. The first electrode is a p-electrode, and the second electrode is an n-electrode.

Preferably, the conductive substrate includes first and second plated layers. The first plated layer has a two-layer structure in which Ni and Au are sequentially laminated, and the second plated layer has a three-layer structure in which Au, Ni, and Au are sequentially laminated.

According to a further aspect of the invention, a method of manufacturing a vertical GaN-based LED comprises forming a light emission structure in which an n-type GaN-based semiconductor layer, an active layer, and a p-type GaN-based semiconductor layer are sequentially laminated on a substrate; etching the light emission structure such that the light emission structure is divided into units of LED; forming a p-electrode on each of the divided light emission structures; filling a non-conductive material between the divided light emission structures; forming a metal seed layer on the resulting structure; forming a first plated layer on the metal seed layer excluding a region between the light emission structures; forming a second plated layer on the metal seed layer between the first plated layers; separating the substrate from the light emission structures; removing the non-conductive material between the light emission structures exposed by separating the substrate; forming an n-electrode on the n-type GaN-based semiconductor layer; and removing portions of the metal seed layer and the second plated layer between the light emission structures.

Preferably, the non-conductive material is photoresist.

Preferably, the method further comprises, before the forming of the p-electrode, forming an insulating layer along the upper surface of the substrate including the divided light emission structures; and selectively etching the insulating layer such that a current blocking layer is formed on the central portion of the upper surface of the light emission structure, and simultaneously, a protective film is formed in either side surface of the light emission structure.

Preferably, the method further comprises, after the forming of the light emission structure, removing a lower portion of the substrate by a predetermined thickness through a lapping and polishing process.

Preferably, the forming of the first plated layer includes forming photoresist on the metal seed layer between the light emission structures; forming the first plated layer on the metal seed layer between the photoresists; and removing the photoresists.

Preferably, the removing of the portions of the metal seed layer and the second plated layer is performed through any one of dicing, scribing, and wet-etching.

Preferably, the method further comprises, before the forming of the n-electrode, forming surface irregularities on the n-type GaN-based semiconductor layer; and forming a contact hole by removing a portion of the n-type GaN-based semiconductor layer, where the n-electrode is to be formed, by a predetermined thickness.

Preferably, the first plated layer has a two-layer structure in which Ni and Au are sequentially laminated.

Preferably, the second plated layer has a three-layer structure in which Au, Ni, and Au are sequentially laminated.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1A to 1F are sectional views sequentially showing a method of manufacturing a conventional vertical GaN-based LED;

FIG. 2 is a sectional view illustrating the structure of another conventional vertical GaN-based LED;

FIG. 3 is a sectional view illustrating the structure of a vertical GaN-based LED according to a first embodiment of the invention;

FIGS. 4A to 4M are sectional views sequentially showing a method of manufacturing a vertical GaN-based LED according to the first embodiment of the invention;

FIG. 5 is a sectional view of a vertical GaN-based LED according to a second embodiment of the invention;

FIGS. 6 to 8 are plan views showing the shape of a reflecting electrode according to the invention;

FIGS. 9A to 9E are sectional views sequentially showing a method of manufacturing a vertical GaN-based LED according to the second embodiment of the invention;

FIGS. 10 to 12 are sectional views illustrating the structure of a vertical GaN-based LED according to a third embodiment of the invention;

FIGS. 13A to 13E are sectional views sequentially showing a method of manufacturing a vertical GaN-based LED according to the third embodiment of the invention;

FIG. 14 is a sectional view illustrating the structure of a vertical GaN-based LED according to a fourth embodiment; and FIGS. 15A to 15E are sectional views sequentially showing a method of manufacturing a vertical GaN-based LED according to the fourth embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, embodiments of the present invention will be described in detail with reference to the accompanying drawings.

First Embodiment

Referring to FIGS. 3 and 4A to 4M, a vertical GaN-based LED and a method of manufacturing the same according to a first embodiment will be described in detail.

FIG. 3 is a sectional view illustrating the structure of a vertical GaN-based LED according to the first embodiment of the invention. FIGS. 4A to 4M are sectional views sequentially showing a method of manufacturing a vertical GaN-based LED according to the first embodiment of the invention.

As shown in FIG. 4A, a light emission structure 320 is formed on a substrate 310, the light emission structure 320 being composed of a GaN-based semiconductor layer. In the light emission structure 320, an n-type GaN-based semiconductor layer 321, an active layer 322 composed of a GaN/InGaN layer with a multi-quantum well structure, and a p-type GaN-based semiconductor layer 323 are sequentially laminated.

Preferably, the substrate 310 is formed of a transparent material including sapphire. In addition to sapphire, the substrate 310 may be formed of ZnO (zinc oxide), GaN (gallium nitride), SiC (silicon carbide), or AlN (aluminum nitride).

The n-type and p-type GaN-based semiconductor layer 321 and 323 and the active layer 322 may be formed of GaN-based semiconductor materials having a compositional formula of $Al_xIn_yGa_{(1-x-y)}N$ (here, $0 \leq x \leq 1$, $0 \leq y \leq 1$, and $0 \leq x+y \leq 1$). Further, the n-type and p-type GaN-based semiconductor layer 321 and 323 and the active layer 322 may be formed through a well-known nitride deposition process such as MOCVD (Metal Organic Chemical Vapor Deposition) or MBE (Molecular Beam Epitaxy).

The active layer 322 may be formed to have a single-quantum well structure or double-hetero structure. Further, depending on an amount of indium (In) composing the active layer 322, it is determined whether a diode is a green light emitting diode or blue light emitting diode. More specifically, as for a light emitting diode having blue light, about 22% indium is used. As for a light emitting diode having green light, about 40% indium is used. That is, an amount of indium to be used for forming the active layer 322 changes in accordance with a blue or green wavelength.

As described above, the active layer 322 has a large effect on a characteristic and reliability of a GaN-based LED. Therefore, in an overall process of manufacturing a GaN-based LED, the active layer 322 should be protected from defects such as conductor penetration and the like.

Next, as shown in FIG. 4B, a lower portion of the substrate 310 is removed by a predetermined thickness through a lapping and polishing process. The lapping and polishing process, which is performed so as to easily perform an LLO (laser lift-off) process of the sapphire substrate, may be omitted.

Then, as shown in FIG. 4C, the light emission structure 320 is etched so as to be divided into units of LED. As the light emission structure 320 is previously etched so as to be divided, the GaN-based semiconductor layers composing the light emission structure 320 can be prevented from being damaged by laser at the time of the subsequent LLO process.

Subsequently, an insulating layer (not shown) is formed along the upper surface of the substrate 310 including the respective divided light emission structures 320. Then, the insulating layer is selectively etched so that a current blocking layer 330 is formed on the central portion of the upper surface of the light emission structure 320, and simultaneously, a protecting film 340 is formed in either side surface of the light emission structure 320, as shown in FIG. 4D.

The current blocking layer 330 spreads a current, which is concentrated in the lower portion of an n-electrode 380 to be subsequently formed, into the other region. Then, a current spreading effect increases so that uniform light emission can be achieved.

Next, as shown in FIG. 4E, a p-electrode 350 is formed on the light emission structure 320 where the current blocking layer 330 is not formed. Preferably, the p-electrode 350 is formed of an Ag-based or Al-based material so as to serve as an electrode and reflecting film.

As described above, the p-electrode 350 is formed where the current blocking layer 330 is not formed. Although not shown, however, the p-electrode 350 may be formed on the light emission structure 320 so as to cover the current blocking layer 330.

Next, as shown in FIG. 4F, first photoresist PR1 as a non-conductive material is filled between the respective divided light emission structures 320.

In this embodiment, the first photoresist PR1 blocks atoms composing a metal seed layer 360 from penetrating into the active layer 322, thereby preventing junction leakage and a short circuit. The metal seed layer 360 is formed in a subsequent process.

Then, as shown in FIG. 4G, the metal seed layer 360 is formed on the resulting structure. The metal seed layer 360 serves a crystalline nucleus at the time of a plating process of a structure support layer 370 to be described below. Such a metal seed layer 360 may be formed by a sputtering method or a vacuum deposition method.

Subsequently, as shown in FIG. 4H, second photoresist PR2 is formed on the metal seed layer 360 between the light emission structures 320, and a first plated layer 370a is formed on the metal seed layer 360 between the second photoresists PR2 through an electroplating process. Preferably, the first plated layer 370a is formed with a two-layer structure in which Ni and Au are sequentially laminated. Between them, the Au prevents the surface of the Ni from being oxidized and enhances adhesion with a second plated layer 370b to be described below.

Next, as shown in FIG. 4I, the second photoresist PR2 is removed, and a second plated layer 370b is formed on the metal seed layer 360 between the first plated layers 370a and 370a, thereby forming a structure support layer 370 composed of the first and second plated layers 370a and 370b.

Preferably, the second plated layer 370b is formed with a three-layer structure in which Au, Ni, and Au are sequentially laminated. Among them, the lowermost Au enhances adhesion with the first plated layer 370a. Further, the uppermost Au prevents the surface of Ni from being oxidized and enhances adhesion at the time of a die bonding process of a subsequent packaging process.

In the related art, the overall structure including the structure support layer 170 is bent due to a difference in thermal expansion coefficient between the light emission structure 120 and the structure support layer 170 which is formed up to the region between the respective light emission structures 120. According to this embodiment, however, the first photoresist PR1 is formed between the respective divided light emission structures 320, instead of the structure support layer. Further, the structure support layer 370 according to the invention is formed only on the light emission structure 320 at a predetermined thickness. Therefore, the overall structure including the structure support layer 370 can be prevented from being bent, which makes it possible to overcome difficulties in carrying out a subsequent process.

The structure support layer 370 serves as a support layer and electrode of a finalized LED. Further, the structure support layer 370 is composed of metal such as Ni or Au having excellent thermal conductivity. Therefore, heat to be generated from the LED can be easily discharged outside. Accordingly, although a large current is applied to the LED, heat can be effectively discharged so that characteristics of the LED can be prevented from being degraded.

Next, as shown in FIG. 4J, the substrate 310 is separated from the light emission structure 320 through an LLO process.

Continuously, as shown in FIG. 4K, the first photoresist PR1 and a portion of the protective film 340 between the light emission structures 320 are removed, the portion of the protective film 340 being exposed by separating the substrate 310. Then, on the surface of the n-type GaN-based semiconductor layer 321, surface irregularities 321a are formed in order to enhance light extraction efficiency.

Then, as shown in FIG. 4L, a portion of the n-type GaN-based semiconductor layer 321, on which an n-electrode 380 is to be formed, is removed by a predetermined thickness such that a contact hole h is formed. Then, an n-electrode 380 is formed on the contact hole h.

Next, as shown in FIG. 4M, portions of the metal seed layer 360 and the second plated layer 370b between the light emission structures 320 are removed through a dicing process such that the respective light emission structures 320 are separated. Then, a plurality of GaN-based LEDs 300 is formed. At this time, the separation of the GaN-based LEDs 300 may be performed through a laser scribing process or a wet etching process, in addition to the above-described dicing process.

In the related art, the final separation of the GaN-based LEDs 100 is performed through dicing of the structure support layer 170 having a relatively large thickness. In this embodiment, however, the final separation of the GaN-based LEDs 300 is performed through dicing of the metal seed layer 360 and the second plated layer 370b which have a much smaller thickness than the conventional structure support layer 170. Therefore, the light emission structures 320 can be prevented from being broken or damaged at the time of dicing.

The vertical GaN-based LED manufactured according to the above-described process includes the conductive substrate 370, the metal seed layer 360 formed on the conductive substrate 370, and the light emission structure 320 formed on the metal seed layer 360, as shown in FIG. 3.

The conductive substrate 370 is composed of the first and second plated layers 370a and 370b. As described above, the first plated layer 370a has a two-layer structure in which Ni and Au are sequentially laminated. The second plated layer 370b has a three-layer structure in which Au, Ni, and Au are sequentially laminated.

The light emission structure 320 includes the n-type GaN-based semiconductor layer 321, the active layer 322, and the p-type GaN-based semiconductor layer 323. On the outer surface of the light emission structure 320, the protective film 340 is formed.

The current blocking layer 330 is formed on the central portion of the lower surface of the p-type GaN-based semiconductor layer 323. Further, the p-electrode 350 is formed on the p-type GaN-based semiconductor layer 323 and in either side of the current blocking layer 330. The n-electrode 380 is formed on the n-type GaN semiconductor layer 321.

Further, the n-type GaN-based semiconductor layer 321 has the surface irregularities 321a formed on the upper surface thereof.

Second Embodiment

<Vertical GaN-Based LED>

Referring to FIGS. 5 to 8, a vertical GaN-based LED according to a second embodiment of the invention will be described in detail.

FIG. 5 is a sectional view of a vertical GaN-based LED according to the second embodiment of the invention. FIGS. 6 to 8 are plan views showing the shape of a reflecting electrode according to the invention.

As shown in FIG. 5, the vertical GaN-based LED 400 according to the second embodiment has an n-electrode 410 formed in the uppermost portion thereof.

Under the n-electrode 410, an n-type GaN-based semiconductor layer 420 is formed. More specifically, the n-type GaN-based semiconductor layer 420 may be formed of a GaN layer or GaN/AlGaN layer doped with n-type impurities.

In order to enhance a current spreading effect, a transparent electrode (not shown) is further formed between the n-electrode 410 and the n-type GaN-based semiconductor layer 420.

Under the n-type GaN-based semiconductor layer 420, an active layer 430 and a p-type GaN-based semiconductor layer 440 are sequentially laminated, thereby forming a light emission structure. The active layer 430 of the light emission structure may be formed to have a multi-quantum well structure composed of an InGaN/GaN layer. The p-type GaN-based semiconductor layer 440 may be formed of a GaN layer or GaN/AlGaN layer doped with p-type impurities, similar to the n-type GaN-based semiconductor layer 420.

Under the p-type GaN-based semiconductor layer 440 of the light emission structure, a plurality of reflecting electrodes 450 are formed so as to be spaced at a predetermined distance from each other. In the above-described conventional vertical GaN-based LED (refer to FIG. 2), the reflecting layer 250 is formed on the entire surface of the p-type GaN-based semiconductor layer 440. In the vertical GaN-based LED according to this embodiment, however, the plurality of reflecting electrodes 450 are formed under the p-type GaN-based semiconductor layer 440 so as to be spaced at a predetermined distance from each other. Therefore, a polarization effect, which is generated by the reflecting electrodes 450 when the LED operates, is localized so that a piezoelectric effect can be reduced.

Preferably, the reflecting electrode 450 is formed with a single-layer or multi-layer structure composed of one or more elements selected from the group consisting of Pd, Ni, Au, Ag, Cu, Pt, Co, Rh, Ir, Ru, Mo, W and an alloy including at least one of them.

The reflecting electrode 450 may be formed in a circle shown in FIG. 6, in an ellipse shown in FIG. 7, or in a square shown in FIG. 8. Further, the shape of the reflecting electrode 450 is not limited to the above-described shapes, but can be transformed into an equilateral polygon such as an equilateral pentagon or hexagon, an asymmetric polygon, or a combination of a circle, an ellipse, an equilateral polygon, and an asymmetric polygon, without departing from the scope of the present invention.

Preferably, the reflecting electrode 450 is formed to have a width of 0.5 to 500 µm. When the width of the reflecting electrode 450 is smaller than 0.5 µm, the reflecting electrode 450 is extremely reduced in size such that there is a limitation in serving as a reflecting electrode. When the width of the reflecting electrode 450 is larger than 500 µm, it is difficult to obtain the reduction in piezoelectric effect. Therefore, it is preferable that the reflecting electrode 450 has the above-described range of width.

Under the p-type GaN-based semiconductor layer 440 including the reflecting electrode 450, a barrier layer 455 is formed. While the reflecting electrode 450 forms ohmic contact with the p-type GaN semiconductor layer 440, the barrier layer 455 is formed to have a Shottky contact characteristic, thereby serving as a current blocking layer as well. Meanwhile, when the reflecting electrode 450 is formed of Ag or the like, the barrier layer 455 serves to prevent Ag composing the reflecting electrode 450 from being diffused.

Preferably, the barrier layer 455 may be formed of metal having a single-layer or multi-layer structure of one or more elements selected from the group consisting of Al, Ti, Zr, Hf, Ta, Cr, In, Sn, Pt, Au, and an alloy including at least one of them. Further, instead of the above-described metal, TCO (transparent conductive oxide) such as ITO (indium tin oxide), IZO (indium zinc oxide), IO (indium oxide), ZnO or SnO$_2$ can be applied.

Under the barrier layer 455, a bonding layer 460 is formed.

Under the bonding layer 460, a structure support layer 470 is formed so as to serve as a support layer and electrode of the LED. The structure support layer 470 is generally formed of an Si substrate, a Ge substrate, an SiC substrate, a GaAs substrate, or a metal layer, in consideration of thermal stability of the LED.

According to the second embodiment, the plurality of reflecting electrodes 450 are formed under the p-type GaN-based semiconductor layer 440 so as to be spaced at a predetermined distance from each other. Therefore, a polarization effect, which is generated by the reflecting electrodes 450 when the LED operates, is localized so that a piezoelectric effect can be reduced. As a result, it is possible to enhance reliability of the LED.

Method of Manufacturing Vertical GaN-Based LED

Hereinafter, a method of manufacturing a vertical GaN-based LED according to the second embodiment of the invention will be described in detail with reference to FIGS. 9A to 9E.

FIGS. 9A to 9E are sectional views sequentially showing the method of manufacturing a vertical GaN-based LED according to the second embodiment of the invention.

As shown in FIG. 9A, an n-type GaN semiconductor layer 420, an active layer 430, a p-type GaN-based semiconductor layer 440 are sequentially grown on a sapphire substrate 490, thereby forming a light emission structure. As described above, the n-type GaN-based semiconductor layer 420 may be formed of a GaN layer or GaN/AlGaN layer doped with n-type impurities, the active layer 430 may be formed in a multi-quantum well structure composed of an InGaN/GaN layer, and the p-type GaN-based semiconductor layer 440 may be formed of a GaN layer or GaN/AlGaN layer doped with p-type impurities.

Then, on the p-type GaN-based semiconductor layer 440 of the light emission structure, a plurality of reflecting electrodes 450 are formed so as to be spaced at a predetermined distance from each other. Preferably, the reflecting electrode 450 is formed with a single-layer or multi-layer structure composed of one or more elements selected from the group consisting of Pd, Ni, Au, Ag, Cu, Pt, Co, Rh, Ir, Ru, Mo, W and an alloy including at least one of them. Further, the reflecting electrode 450 may be formed in various shapes including an equilateral polygon, a circle, an asymmetric polygon, an ellipse, and a combination thereof. Further, it is preferable that the reflecting electrode 450 is formed to have a width of 0.5 to 500 µm.

In this embodiment, the plurality of reflecting electrodes 450 are formed on the p-type GaN-based semiconductor layer 440 so as to be spaced at a predetermined distance from each other. Therefore, a polarization effect, which is generated by the reflecting electrodes 450 when the LED operates, is localized so that a piezoelectric effect can be reduced.

As shown in FIG. 9B, a barrier layer 455 is formed on the p-type GaN-based semiconductor layer 440 including the plurality of reflecting electrodes 450. Preferably, the barrier layer 455 is formed so as to have a Shottky contact characteristic with the p-type GaN-based semiconductor layer 440. For this, the barrier layer 455 may be formed of metal having a single-layer or multi-layer structure of one or more elements selected from the group consisting of Al, Ti, Zr, Hf, Ta, Cr, In, Sn, Pt, Au, and an alloy including at least one of them. Further, instead of the above-described metals, TCO (transparent conductive oxide) such as ITO (indium tin oxide), IZO (indium zinc oxide), IO (indium oxide), ZnO and SnO$_2$ can be applied.

Next, as shown in FIG. 9C, a bonding layer 460 and a structure support layer 470 are sequentially formed on the barrier layer 455. The structure support layer 470 is generally formed of an Si substrate, a Ge substrate, an SiC substrate, a GaAs substrate, or a metal layer, in consideration of thermal stability of the LED.

Then, as shown in FIG. 9D, the sapphire substrate 490 is removed through an LLO process.

Next, as shown in FIG. 9E, an n-electrode 410 is formed on the n-type GaN-based semiconductor layer 420 where the sapphire substrate 490 is removed. In order to enhance a current spreading effect, a transparent electrode (not shown) is further formed on the n-type GaN-based semiconductor layer 420, before the n-electrode 410 is formed.

Third Embodiment

<Vertical GaN-Based LED>

Now, a third embodiment of the invention will be described with reference to FIGS. 10 to 12. The descriptions of the same portions as those of the second embodiment will be omitted.

FIGS. 10 to 12 are sectional views illustrating the structure of a vertical GaN-based LED according to the third embodiment of the invention.

As shown in FIGS. 10 to 12, the vertical GaN-based LED according to the third embodiment has almost the same construction as the vertical GaN-based LED according to the second embodiment. However, the vertical GaN-based LED according to the third embodiment is different from the vertical GaN-based LED according to the second embodiment in that the barrier layer 455 is formed of an insulating film such that a portion of the reflecting electrode is formed to be exposed. The insulating film may be formed of an oxide-based or nitride-based material such as $SiO_2$, $Al_2O_3$, $TiO_2$, ZrO, HfO, SiN, AlN or the like.

The barrier layer 455 composed of an insulating film may be formed along the surfaces of the reflecting electrodes 450 and the p-type GaN-based semiconductor layer 440 excluding portions of the lower surfaces of the reflecting electrodes 450, as shown in FIG. 10. Further, the barrier layer 455 may be formed so as to expose portions of the lower surfaces of the reflecting electrodes 450, while being filled in spaces between the plurality of reflecting electrodes 450, as shown in FIG. 11. Furthermore, the barrier layer 455 may be formed on the lower surface of the p-type GaN-based semiconductor layer 440 between the plurality of reflecting electrodes 450 such that the entire lower surfaces and portions of the side surfaces of the reflecting electrodes 450 are exposed, as shown in FIG. 12. In this case, the barrier layer 455 is formed to have a smaller thickness than the reflecting electrodes 450.

The barrier layer 455 composed of an insulating film is not limited to the structures shown in FIGS. 10 to 12. The structure of the barrier layer 455 can be transformed in various manners, without departing from the scope of the present invention.

That is, in the vertical GaN-based LED according to the third embodiment, the barrier layer 455 is formed of an insulating film, and portions of the reflecting electrodes 450 are formed to be exposed so that the reflecting electrodes 450 and the structure support layer 470 can be electrically connected.

Such a vertical GaN-based LED according to the third embodiment can obtain the same operation and effect as those of the second embodiment.

<Method of Manufacturing Vertical GaN-Based LED>

Now, a method of manufacturing a vertical GaN-based LED according to the third embodiment of the invention will be described in detail with reference to FIGS. 13A to 13E.

FIGS. 13A to 13E are sectional views sequentially showing the method of manufacturing a vertical GaN-based LED according to the third embodiment of the invention.

As shown in FIG. 13A, an n-type GaN-based semiconductor layer 420, an active layer 430, and a p-type GaN-based semiconductor layer 440 are sequentially grown on a sapphire substrate 490, thereby forming a light emission structure.

Then, on the p-type GaN-based semiconductor layer 440, a plurality of reflecting electrodes 450 are formed so as to be spaced at a predetermined distance from each other.

Next, as shown in FIG. 13B, a barrier layer 455 is formed on the p-type GaN-based semiconductor layer 440 including the plurality of reflecting electrodes 450. The barrier layer 455 is formed of an insulating film such as $SiO_2$, $Al_2O_3$, $TiO_2$, ZrO, HfO, SiN, AlN or the like. At this time, the barrier layer 455 is formed to expose portions of the reflecting electrodes 450 such that the reflecting electrodes 450 are electrically connected to a structure support layer 470 to be subsequently formed.

Subsequently, as shown in FIG. 13C, a bonding layer 460 and a structure support layer 470 are sequentially formed on the entire structure including the barrier layer 455.

Then, as shown in FIG. 13D, the sapphire substrate 490 is removed using an LLO process.

Next, as shown in FIG. 13E, an n-electrode 410 is formed on the n-type GaN-based semiconductor layer 420 where the sapphire substrate 490 is removed.

Fourth Embodiment

<Vertical GaN-Based LED>

Now, a fourth embodiment of the invention will be described with reference to FIG. 14. The descriptions of the same portions as those of the second embodiment will be omitted.

FIG. 14 is a sectional view illustrating the structure of a vertical GaN-based LED according to a fourth embodiment.

As shown in FIG. 14, the vertical GaN-based LED according to the fourth embodiment has almost the same construction as the vertical GaN-based LED according to the second embodiment. However, the vertical GaN-based LED according to the fourth embodiment is different from the vertical GaN-based LED according to the second embodiment in that the formation positions of the reflecting electrode 450 and the barrier layer 455 to be formed under the p-type GaN-based semiconductor layer 440 are switched and the barrier layer 455 is formed of an insulating film. The insulating film to be used as the barrier layer 455 may be formed of an oxide-based or nitride-based material such as $SiO_2$, $Al_2O_3$, $TiO_2$, ZrO, HfO, SiN, AlN or the like, similar to the second embodiment.

That is, in the vertical GaN-based LED according to the fourth embodiment, the barrier layer 455 is formed of an insulating film. Further, instead of the structure where the barrier layer 455 is formed to expose portions of the reflecting electrodes 450, a plurality of barrier layers 455 are first formed under the p-type GaN-based semiconductor layer 440 so as to be spaced at a distance from each other. Then, a reflecting electrode 450 is formed under the p-type GaN-based semiconductor layer 440 including the barrier layers 455.

In such a vertical GaN-based LED according to the fourth embodiment, portions of the reflecting electrode 450, which come in contact with the p-type GaN-based semiconductor layer 440, are spaced at a predetermined distance from each other by the plurality of barrier layers 455 formed under the p-type GaN-based semiconductor layer 440 at a predetermined distance. Therefore, it is possible to obtain the same operation and effect as the first embodiment.

<Method of Manufacturing Vertical GaN-Based LED>

Hereinafter, a method of manufacturing a vertical GaN-based LED according to the fourth embodiment of the invention will be described in detail with reference to FIGS. 15A to 15E.

FIGS. 15A to 15E are sectional views sequentially showing the method of manufacturing a vertical GaN-based LED according to the fourth embodiment of the invention.

As shown in FIG. 15A, an n-type GaN-based semiconductor layer 420, an active layer 430, and a p-type GaN-based semiconductor layer 440 are sequentially grown on a sapphire substrate 490, thereby forming a light emission structure.

On the p-type GaN-based semiconductor layer 440, a plurality of barrier layers 455 are formed so as to be spaced at a predetermined distance from each other. The barrier layer 455 may be formed of an oxide-based or nitride-based material such as $SiO_2$, $Al_2O_3$, $TiO_2$, ZrO, HfO, SiN, AlN or the like.

As shown in FIG. 15B, the reflecting electrode 450 is formed on the p-type GaN-based semiconductor layer 240 including the barrier layer 455.

As shown in FIG. 15C, a bonding layer 460 and a structure support layer 470 are sequentially formed on the reflecting electrode 450.

As shown in FIG. 15D, the sapphire substrate 490 is removed through an LLO process.

As shown in FIG. 15E, an n-electrode 410 is formed on the n-type GaN-based semiconductor layer 420 where the sapphire substrate 490 is removed.

According to the present invention, the light emission structures are divided into units of LED, and the photoresist is filled between the divided light emission structures. Then, atoms composing the metal seed layer can be prevented from penetrating into the active layer such that junction leakage and a short circuit can be prevented. Further, the overall structure including the structure support layer is prevented from being bent, so that a subsequent process can be easily performed.

Further, the final separation of the LEDs is performed through the dicing of the metal seed layer and the second plated layer having a much smaller thickness than the conventional structure support layer. Therefore, when the dicing process is performed, the light emission structure can be prevented from being broken or damaged, which makes it possible to easily perform the diode separation process.

Further, the plurality of reflecting electrodes is formed under the p-type GaN-based semiconductor layer so as to be spaced at a predetermined distance from each other. Compared with when the reflecting electrode is formed on the entire surface of the p-type GaN-based semiconductor layer, a polarization effect, which is generated by the reflecting electrodes 450 when the LED operates, is localized so that a piezoelectric effect can be reduced.

Therefore, it is possible to enhance a characteristic and reliability of the vertical GaN-based LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A vertical GaN-based semiconductor LED comprising:
a conductive substrate;
a metal seed layer formed on the conductive substrate;
a current blocking layer formed on a central portion of the metal seed layer;
a first electrode formed on the metal seed layer and on either side of the current blocking layer;
a protective film formed on an outer surface of a light emission structure formed on the first electrode; and
a second electrode formed on the light emission structure,
wherein the conductive substrate includes first and second plated layers and the second plated layer physically contacts and surrounds lower parts and side surfaces of the first plated layer.

2. The vertical GaN-based semiconductor LED according to claim 1,
wherein the light emission structure includes a p-type GaN-based semiconductor layer, an active layer, and an n-type GaN-based semiconductor layer.

3. The vertical GaN-based semiconductor LED according to claim 2,
wherein the n-type GaN-based semiconductor layer has surface irregularities formed on the upper surface thereof.

4. The vertical GaN-based semiconductor LED according to claim 1,
wherein the first electrode is a p-electrode.

5. The vertical GaN-based semiconductor LED according to claim 1,
wherein the second electrode is an n-electrode.

6. The vertical GaN-based semiconductor LED according to claim 1,
wherein the first plated layer has a two-layer structure in which Ni and Au are sequentially laminated.

7. The vertical GaN-based semiconductor LED according to claim 1,
wherein the second plated layer has a three-layer structure in which Au, Ni, and Au are sequentially laminated.

* * * * *